(12) United States Patent
Gibson et al.

(10) Patent No.: US 7,896,692 B2
(45) Date of Patent: Mar. 1, 2011

(54) METHOD OF IMPROVING ISOLATION BETWEEN CIRCUITS ON A PRINTED CIRCUIT BOARD

(75) Inventors: Adam W. Gibson, Lynnwood, WA (US); Jeffrey Alan Poulsen, Edmonds, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 0 days.

(21) Appl. No.: 12/467,185

(22) Filed: May 15, 2009

(65) Prior Publication Data

US 2010/0291795 A1 Nov. 18, 2010

(51) Int. Cl.
*H01R 13/60* (2006.01)
(52) U.S. Cl. ..................................... 439/540.1
(58) Field of Classification Search ............... 439/540.1, 439/941, 76.1, 676, 76, 49; 174/260
See application file for complete search history.

(56) References Cited

U.S. PATENT DOCUMENTS

| | | | | |
|---|---|---|---|---|
| 4,737,113 A | * | 4/1988 | Hopper et al. | 439/78 |
| 4,894,024 A | * | 1/1990 | Debortoli et al. | 439/535 |
| 5,186,647 A | * | 2/1993 | Denkmann et al. | 439/395 |
| 5,269,708 A | * | 12/1993 | DeYoung et al. | 439/676 |
| 5,309,630 A | * | 5/1994 | Brunker et al. | 29/842 |
| 5,326,284 A | * | 7/1994 | Bohbot et al. | 439/676 |
| 5,432,484 A | * | 7/1995 | Klas et al. | 333/1 |
| 5,474,474 A | * | 12/1995 | Siemon et al. | 439/620.22 |
| 5,515,021 A | * | 5/1996 | Rynkiewicz | 336/65 |
| 5,562,493 A | * | 10/1996 | Ferrill et al. | 439/536 |
| 5,647,763 A | * | 7/1997 | Arnold et al. | 439/540.1 |
| 5,658,166 A | * | 8/1997 | Freeman et al. | 439/540.1 |
| 5,700,167 A | * | 12/1997 | Pharney et al. | 439/676 |
| 6,086,428 A | * | 7/2000 | Pharney et al. | 439/676 |
| 6,118,075 A | * | 9/2000 | Baker et al. | 174/72 A |
| 6,123,577 A | * | 9/2000 | Contois et al. | 439/535 |
| 6,203,329 B1 | * | 3/2001 | Johnson et al. | 439/66 |
| 6,238,251 B1 | * | 5/2001 | Curtis et al. | 439/680 |
| 6,366,671 B1 | * | 4/2002 | Beavers | 379/438 |
| 6,373,944 B1 | * | 4/2002 | Beavers | 379/438 |
| 6,439,931 B1 | * | 8/2002 | Niitsu et al. | 439/660 |
| 6,504,726 B1 | * | 1/2003 | Grabinger et al. | 361/796 |
| 6,533,618 B1 | * | 3/2003 | Aekins | 439/676 |
| 6,608,764 B2 | * | 8/2003 | Clark et al. | 361/796 |
| 6,840,816 B2 | * | 1/2005 | Aekins | 439/676 |
| 7,048,567 B2 | * | 5/2006 | Regnier et al. | 439/329 |
| 7,053,640 B2 | * | 5/2006 | Feld et al. | 324/755 |
| 7,057,899 B2 | * | 6/2006 | AbuGhazaleh et al. | 361/780 |
| 7,066,771 B2 | * | 6/2006 | Clark et al. | 439/676 |
| 7,112,090 B2 | * | 9/2006 | Caveney et al. | 439/540.1 |
| 7,232,340 B2 | * | 6/2007 | Hammond et al. | 439/607.26 |

(Continued)

*Primary Examiner* — T C Patel
*Assistant Examiner* — Vladimir Imas
(74) *Attorney, Agent, or Firm* — Davis Wright Tremaine LLP; George C. Rondeau, Jr.; Heather M. Colburn

(57) ABSTRACT

A method of improving electrical isolation between a first circuit and a second circuit sharing a common substrate having an effective dielectric constant greater than that of air. The first and second circuits are spaced apart and separated from one another by an intermediate portion of the substrate. The method includes removing a portion of the intermediate portion to replace the portion removed with air thereby reducing the effective dielectric constant of the intermediate portion. By reducing the effective dielectric constant of the intermediate portion, electrical isolation between the first and second circuits is improved thereby reducing crosstalk between the first and second circuits. In particular implementations, the method may be used to reduce alien crosstalk between adjacent communication outlets in a patch panel.

12 Claims, 12 Drawing Sheets

U.S. PATENT DOCUMENTS

| | | | |
|---|---|---|---|
| 7,244,126 B2 * | 7/2007 | Morana et al. | 439/76.1 |
| 7,288,001 B1 * | 10/2007 | Aekins | 439/540.1 |
| 7,294,024 B2 * | 11/2007 | Hammond et al. | 439/676 |
| 7,301,780 B2 * | 11/2007 | AbuGhazaleh et al. | 361/780 |
| 7,396,254 B2 * | 7/2008 | Harmelink et al. | 439/540.1 |
| 7,401,402 B2 * | 7/2008 | Bresche et al. | 29/842 |
| 7,520,757 B2 * | 4/2009 | Bartholomew | 439/76.1 |
| 7,530,854 B2 * | 5/2009 | Aekins | 439/676 |
| 7,534,137 B2 * | 5/2009 | Caveney et al. | 439/540.1 |
| 7,561,438 B1 * | 7/2009 | Liu | 361/766 |
| 7,604,503 B2 * | 10/2009 | Hammond et al. | 439/607.1 |
| 7,607,938 B2 * | 10/2009 | Clark et al. | 439/540.1 |
| 7,612,470 B2 * | 11/2009 | Pincu et al. | 307/85 |
| 7,677,931 B2 * | 3/2010 | Aekins | 439/676 |
| 2002/0031955 A1 * | 3/2002 | Schmidt et al. | 439/676 |
| 2003/0095395 A1 * | 5/2003 | Clark et al. | 361/796 |
| 2005/0136729 A1 * | 6/2005 | Redfield et al. | 439/409 |
| 2005/0176302 A1 * | 8/2005 | Beerwerth et al. | 439/620 |
| 2005/0253662 A1 * | 11/2005 | Seefried | 333/1 |
| 2006/0094291 A1 * | 5/2006 | Caveney et al. | 439/540.1 |
| 2006/0154531 A1 * | 7/2006 | Kim et al. | 439/676 |
| 2006/0256540 A1 * | 11/2006 | AbuGhazaleh et al. | 361/788 |
| 2007/0032129 A1 * | 2/2007 | Kim et al. | 439/540.1 |
| 2007/0105435 A1 * | 5/2007 | Chen et al. | 439/540.1 |
| 2007/0264867 A1 * | 11/2007 | Harmelink et al. | 439/500 |
| 2007/0293094 A1 * | 12/2007 | Aekins | 439/676 |
| 2008/0090454 A1 * | 4/2008 | Hoath et al. | 439/540.1 |
| 2008/0102693 A1 * | 5/2008 | Caveney et al. | 439/540.1 |
| 2008/0280486 A1 * | 11/2008 | Hammond et al. | 439/540.1 |
| 2008/0293294 A1 * | 11/2008 | Clark et al. | 439/540.1 |
| 2008/0299821 A1 * | 12/2008 | Hammond et al. | 439/540.1 |
| 2009/0142968 A1 * | 6/2009 | Goodrich et al. | 439/676 |
| 2009/0227140 A1 * | 9/2009 | Caveney et al. | 439/490 |
| 2010/0041274 A1 * | 2/2010 | Marti et al. | 439/607.01 |

* cited by examiner

US 7,896,692 B2

METHOD OF IMPROVING ISOLATION BETWEEN CIRCUITS ON A PRINTED CIRCUIT BOARD

BACKGROUND OF THE INVENTION

1. Field of the Invention

The present invention is directed generally to methods of reducing crosstalk between electric circuits disposed on a common substrate and more particularly to methods of reducing crosstalk between pairs of adjacent communication outlets including circuits that share a common substrate, such as a printed circuit board.

2. Description of the Related Art

Well known techniques for improving electrical isolation between a first electrical circuit and a nearby second electrical circuit include moving the two circuits further away from one another. A second technique involves strategically arranging the conductors of the two circuits relative to one another. Unfortunately, real world limitations typically limit the designer's ability to implement these approaches to improve electrical isolation between two electrical circuits. For example, physical constraints typically limit how far apart two circuits may be located. Further, physical and manufacturing limitations may limit how the conductors of the two circuits may be strategically arranged relative to one another.

Yet another prior art technique of improving electrical isolation between two electrical circuits includes placing shielding between the conductors of the two circuits. Shielding is generally most effective when it is electrically connected to ground through a low impedance connection. Shielding may be difficult to implement because in some circuit designs, a low impedance connection to ground is not available. Further, some designs simply do not provide a usable connection to ground.

In cases where a connection to ground is not available, some manufactures will use "floating shields." However, there can be problems associated with floating shields. Care must be taken not to induce a significant amount of signal onto a floating shield from any of the surrounding circuits otherwise the shield simply acts as an antenna increasing the amount of coupling between the circuits the shield should be isolating. Regardless of the type of shielding used, shields add cost and complexity to a design. Therefore, it is desirable to avoid using shields whenever possible.

Therefore, a need exists for methods of improving electrical isolation between two or more electrical circuits. A need also exists for a method of reducing alien crosstalk between a pair of adjacent communication outlets including circuits that share a common substrate (e.g., printed circuit board). A patch panel providing a plurality of communication outlets having improved electrical isolation relative to one another is also desirable. The present application provides these and other advantages as will be apparent from the following detailed description and accompanying figures.

BRIEF DESCRIPTION OF THE SEVERAL VIEWS OF THE DRAWING(S)

Figure 3:
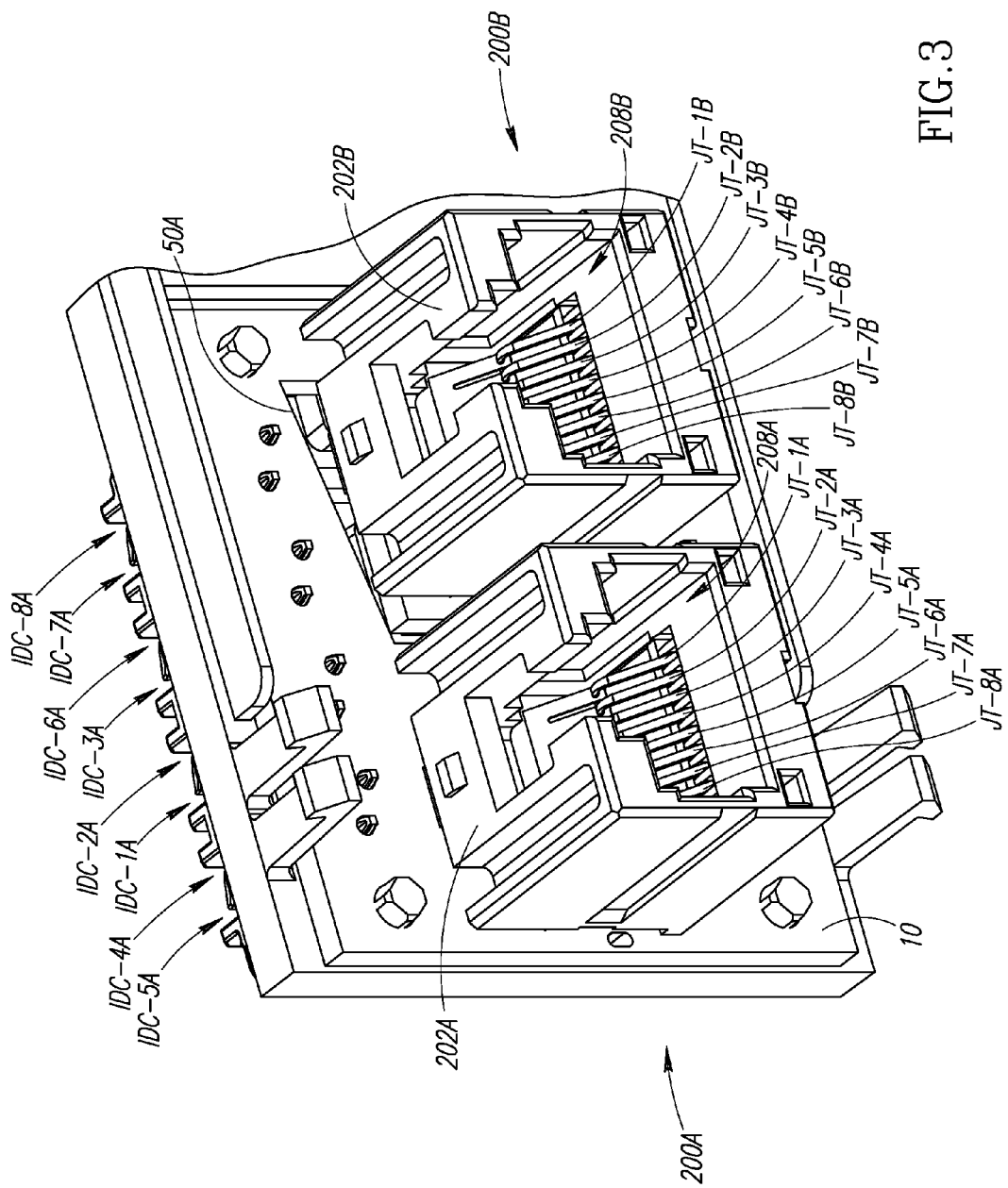
FIG. 3 is a perspective view of the substrate of FIG. 2 incorporated into a pair of adjacent communication outlets, the first set of circuits being coupled to a first plurality of outlet tine contacts of one of the adjacent communication outlets and the second set of circuits being coupled to a second plurality of outlet tine contacts of the other of the adjacent communication outlets.
Figure 6:
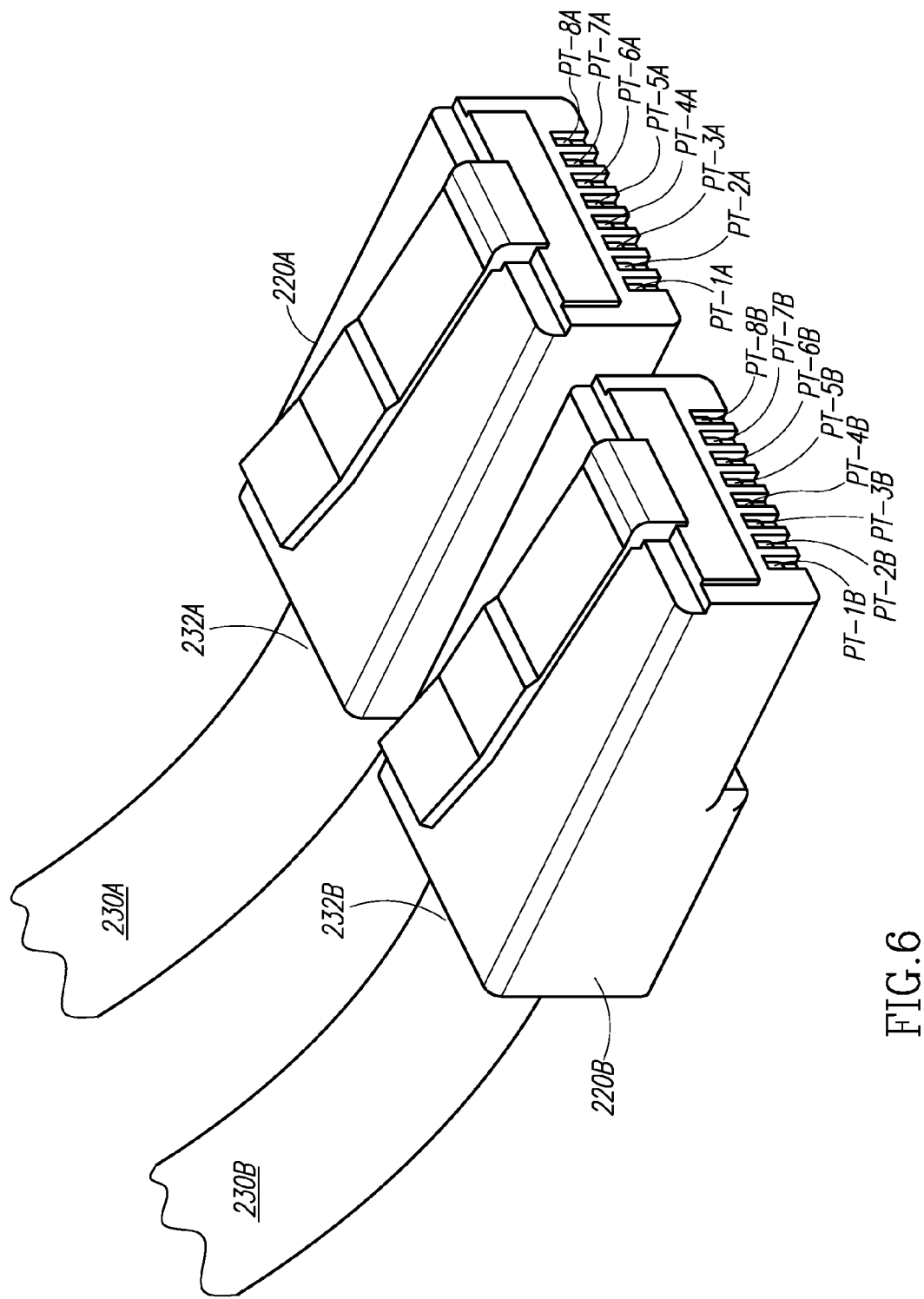

FIG. 6 is a perspective view of a first communication plug coupled to a third communication cable and a second communication plug coupled to a fourth communication cable, the communication plugs being configured to be received inside the pair of communication outlets of FIG. 3 to form a first communication connection between the first communication cable and the third communication cable and a second communication connection between the second communication cable and the fourth communication cable.

Figure 7:
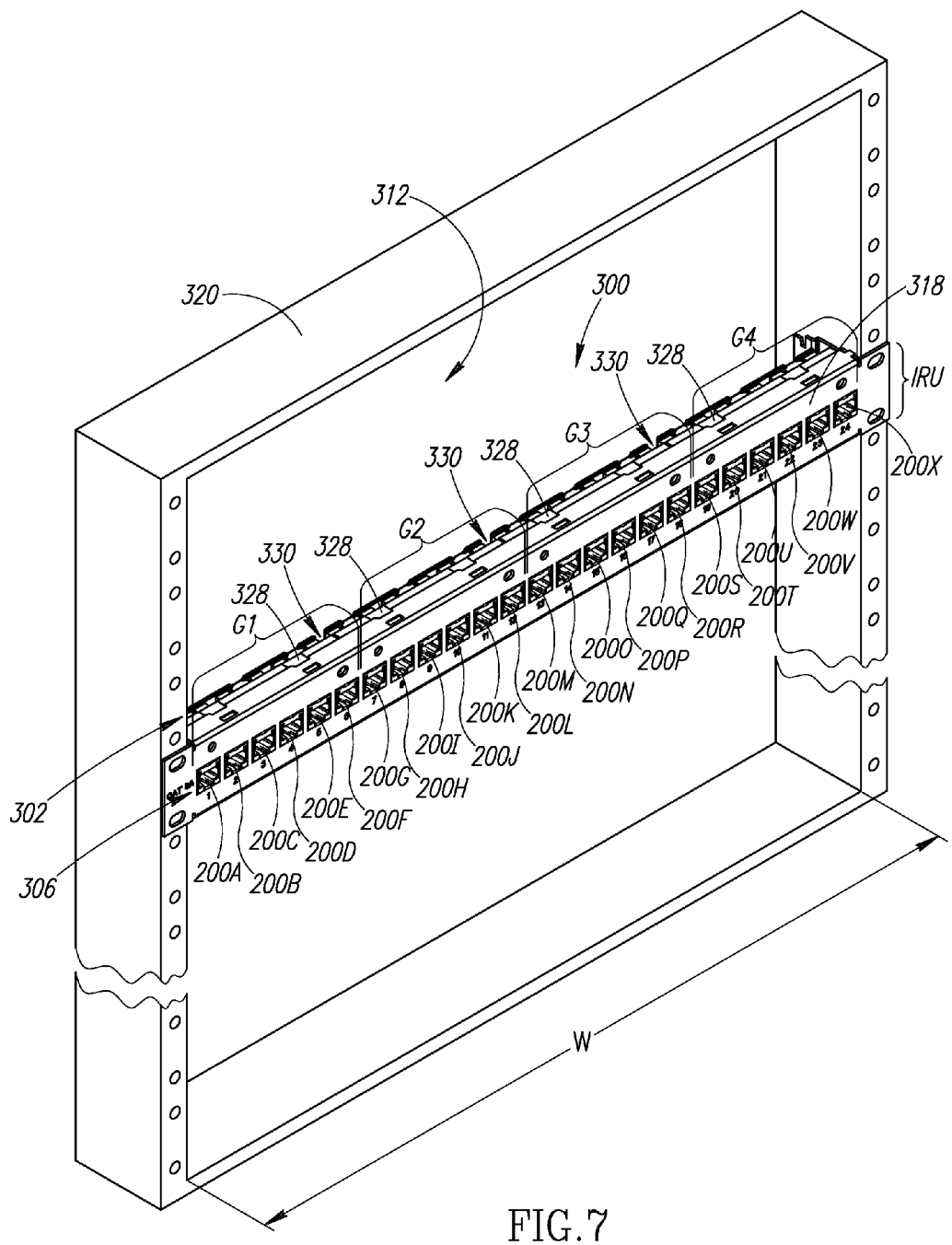

FIG. 7 is a perspective view of a patch panel incorporating twelve pairs of communication outlets like those illustrated in FIG. 3 mounted inside a rack system.

Figure 8:
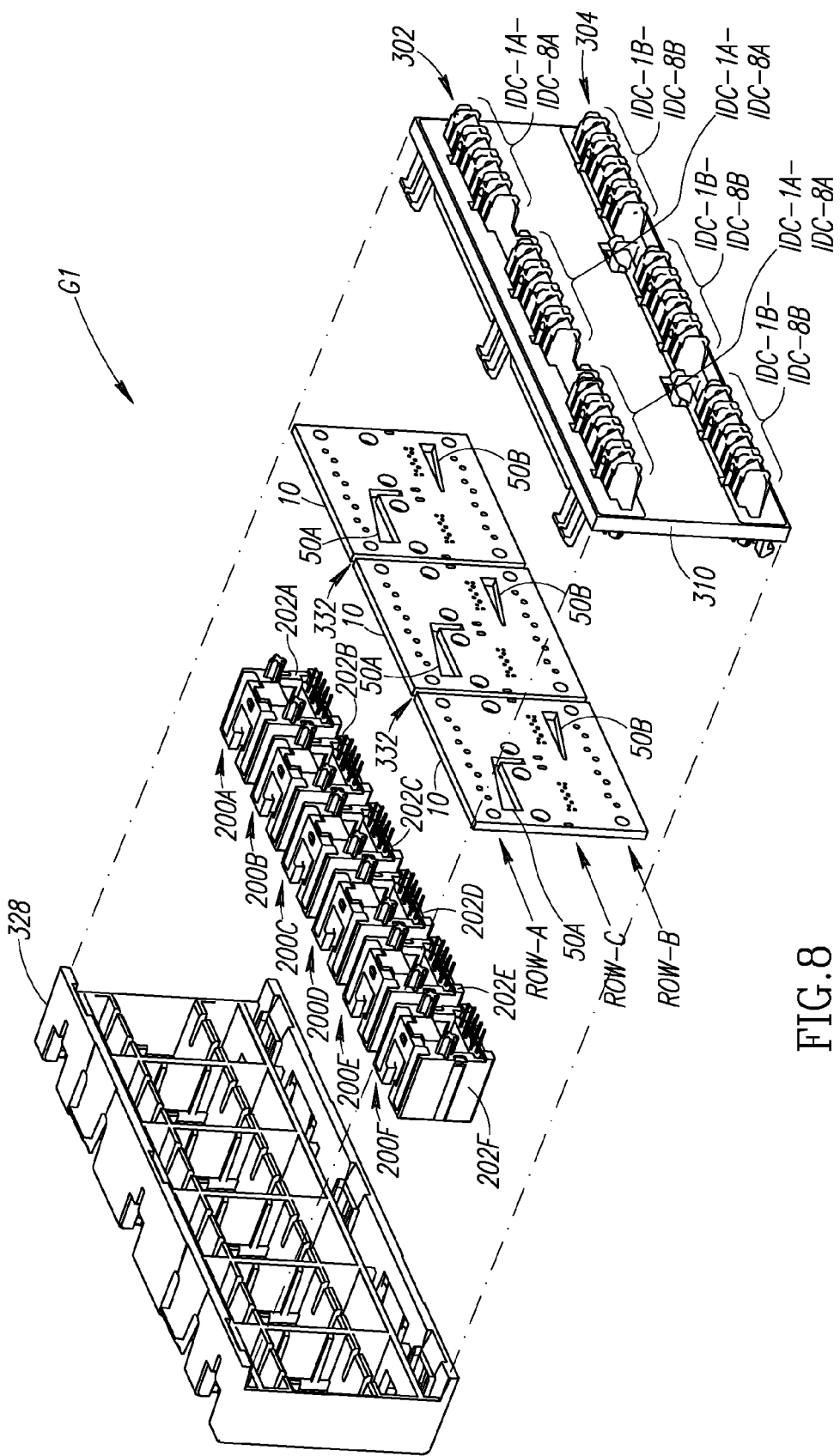

FIG. 8 is an exploded perspective view of the back of three pairs of communication outlets like those illustrated in FIG. 3 arranged in a grouping housed inside a housing configured to be incorporated into the panel of FIG. 7.

Figure 9:
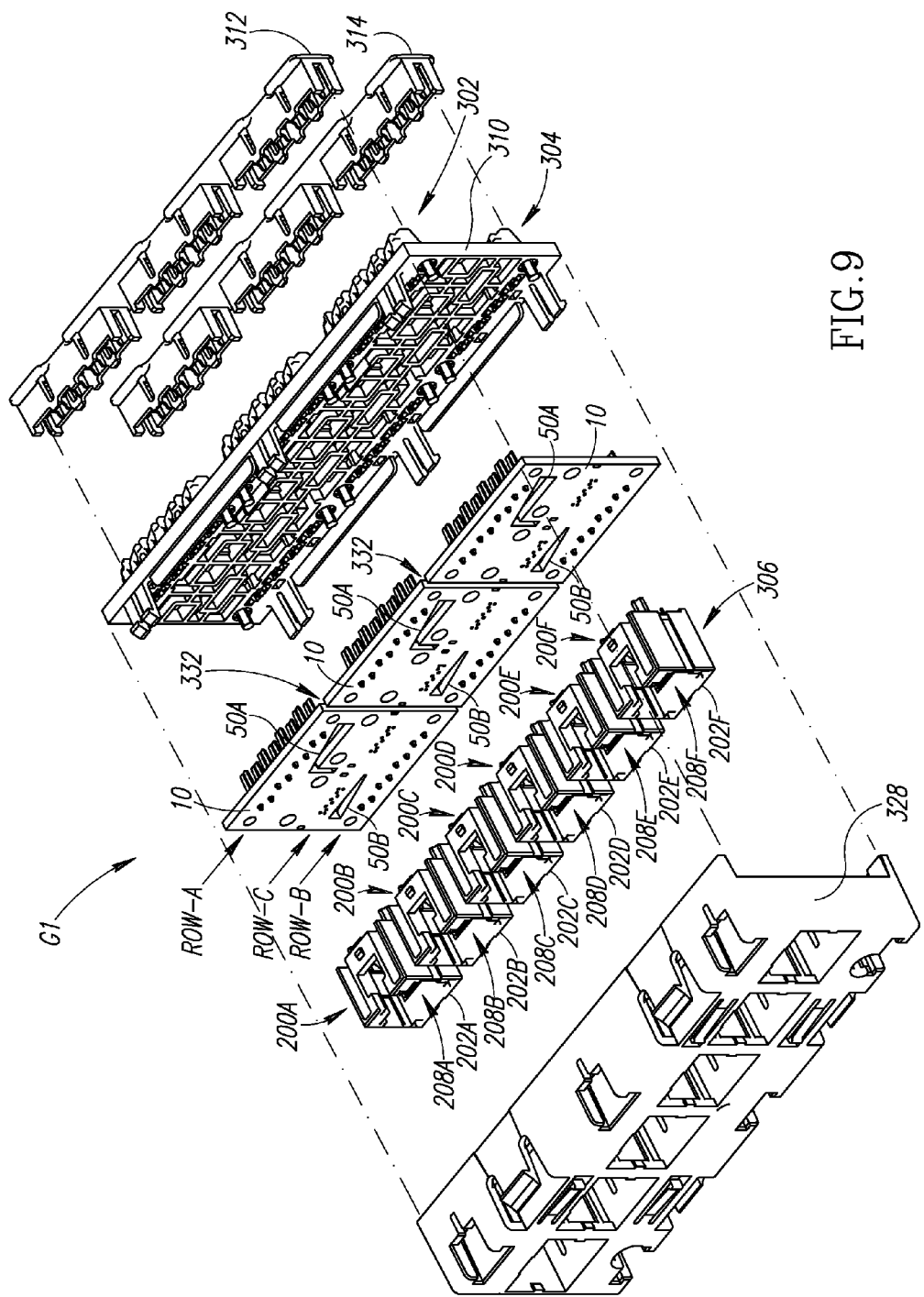

FIG. 9 is an exploded perspective view of the front of the three pairs of communication outlets of FIG. 8 including first and second covers for the insulation displacement connectors.

Figure 10:
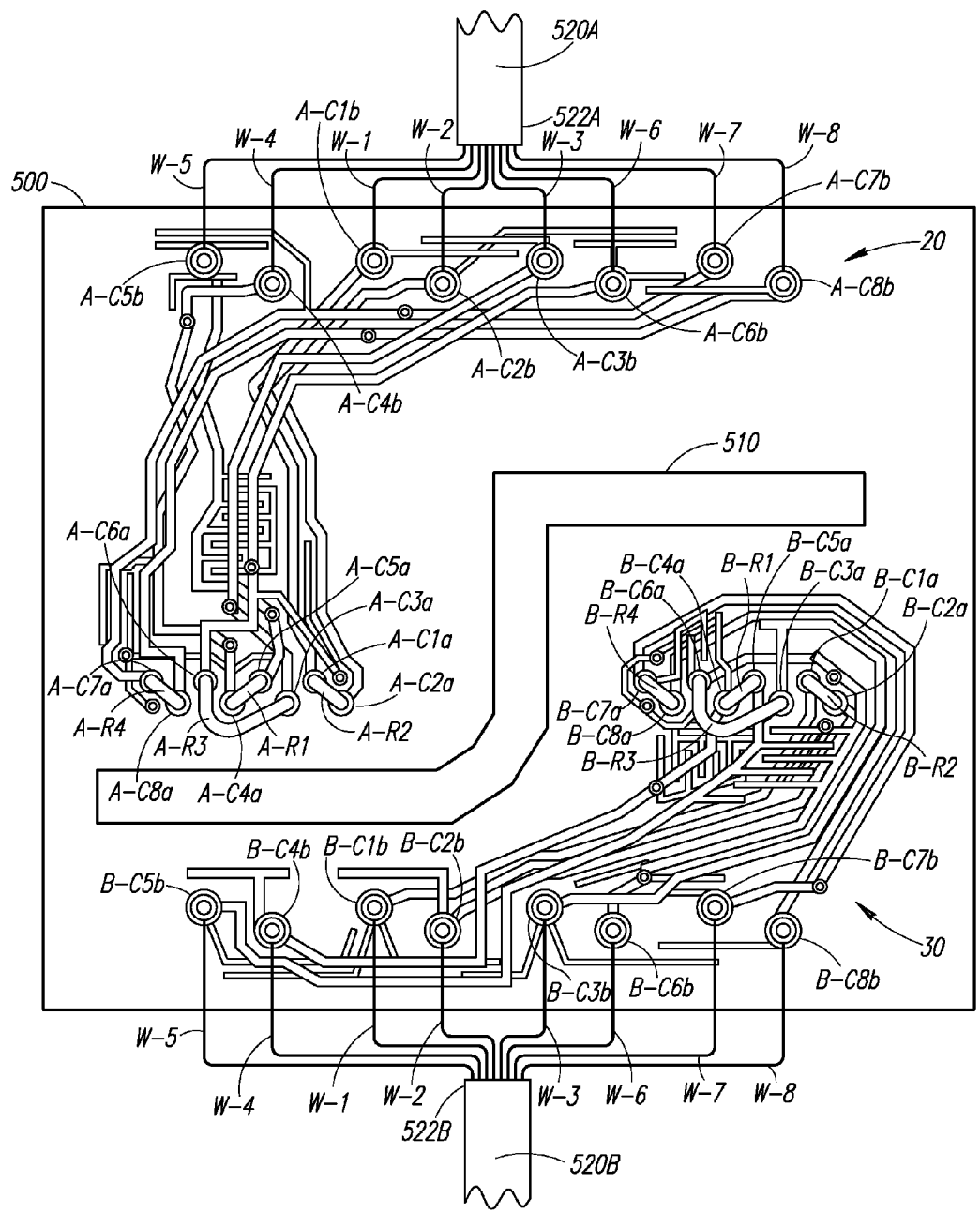

FIG. 10 is an illustration of an experimental setup including a substrate upon which is disposed a first set of circuits spaced by an intermediate portion having a slot from a second set of circuits.

Figure 11:
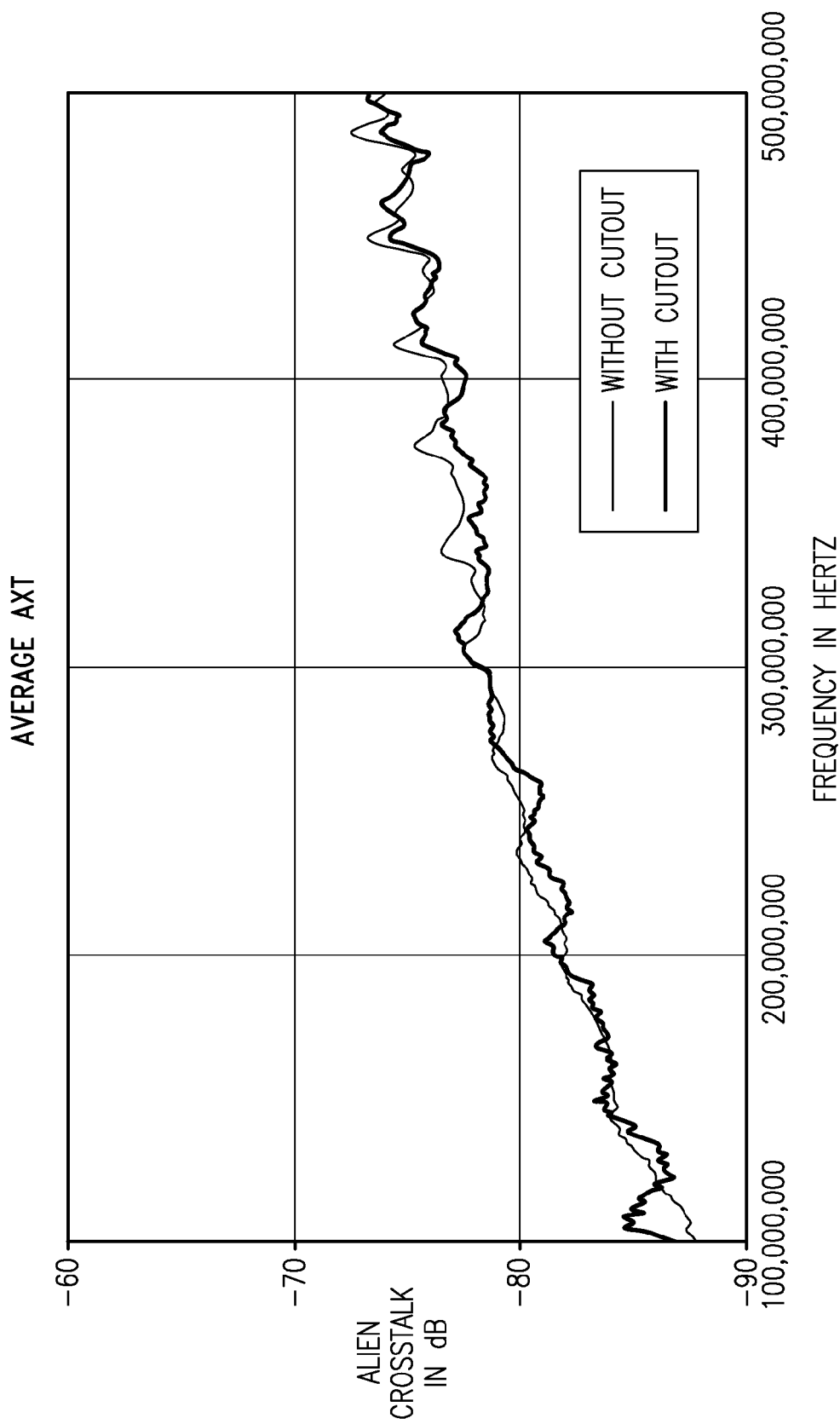

FIG. 11 is a plot of average alien crosstalk measured between each of the circuits of the first set of circuits and each of the circuits of the second set of circuits measured using the experimental setup of FIG. 10 (i.e., a substrate having a cutout portion) and a substrate without a cutout portion.

Figure 12:
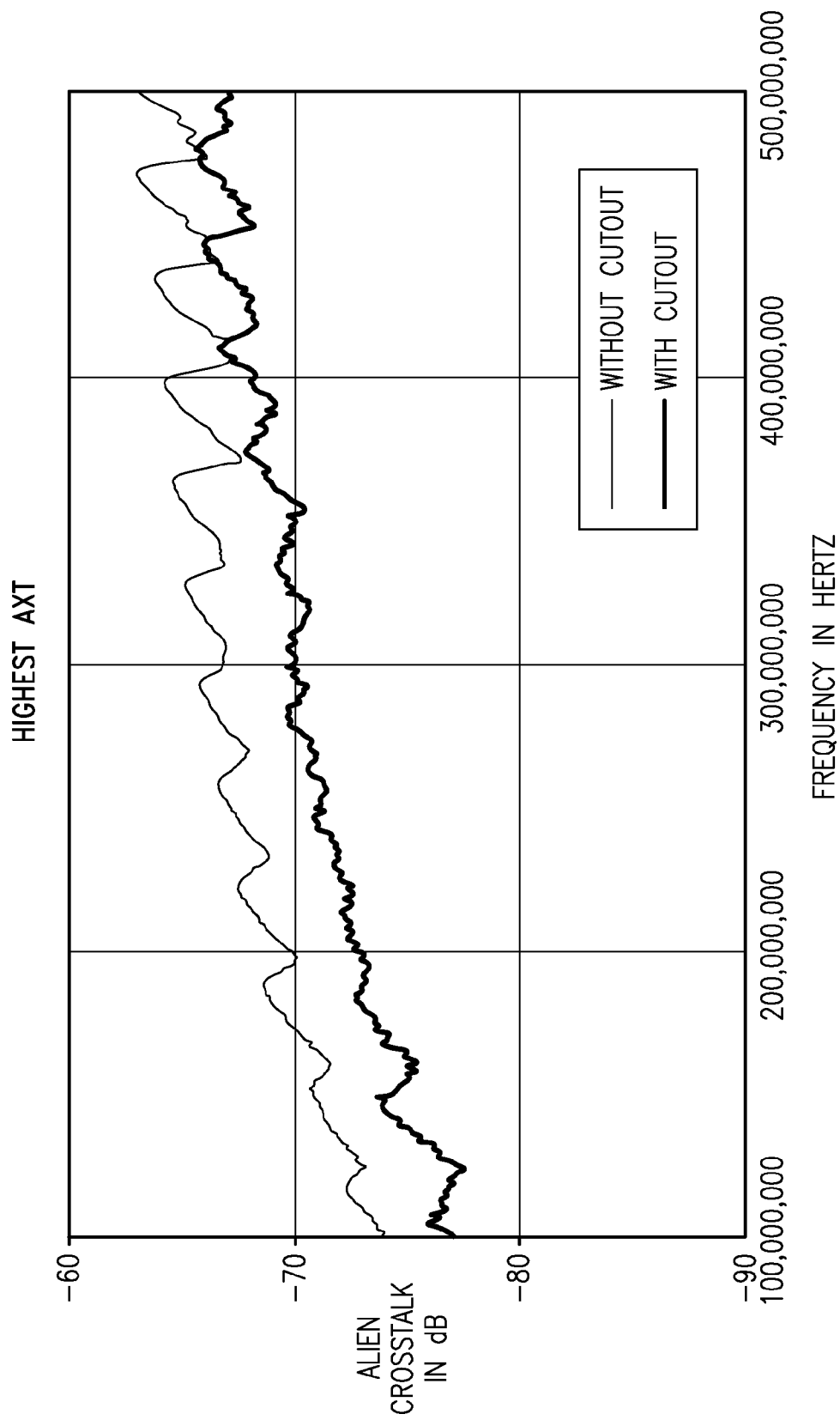

FIG. 12 is a plot of a highest level of alien crosstalk measured between each of the circuits of the first set of circuits and each of the circuits of the second set of circuits measured using the experimental setup of FIG. 10 (i.e., a substrate having a cutout portion) and a substrate without a cutout portion.

DETAILED DESCRIPTION OF THE INVENTION

Aspects of the present invention relate to a method of improving electric isolation between two or more circuits located in close proximity to each other on a common or shared substrate, (e.g., a printed circuit board ("PCB")). While the embodiment implemented in the drawings is described with respect to balanced communications circuits, the invention may be applied to any electrical device in which it is desirable to electrically isolate circuits from one another. This could include, but is not limited to, such things as televisions, radios, computers, receivers, transmitters, and the like.

Overview

Figure 1:
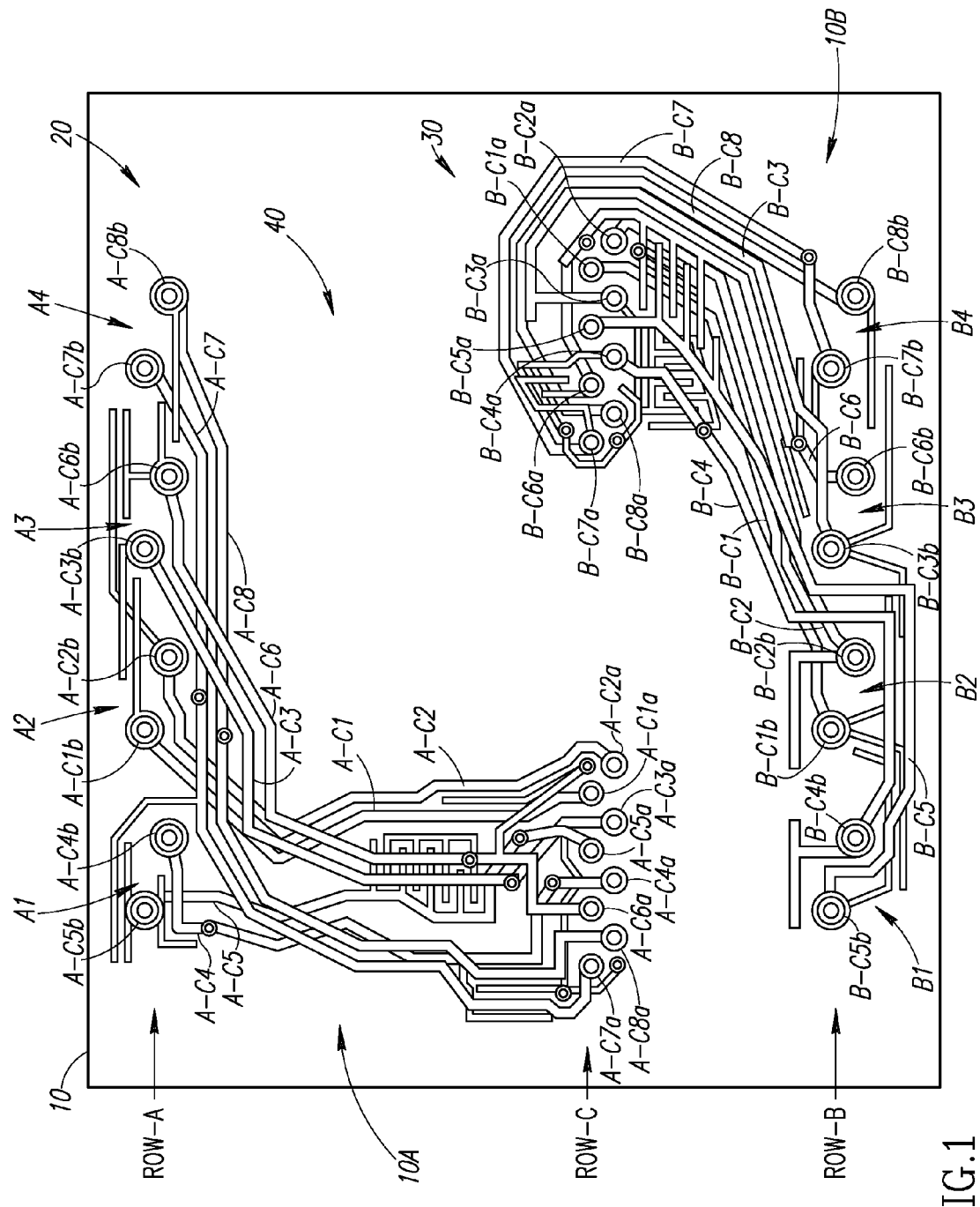
FIG. 1 is an illustration of a substrate upon which is disposed a first set of circuits spaced from a second set of circuits by an intermediate portion of the substrate.
Figure 2:
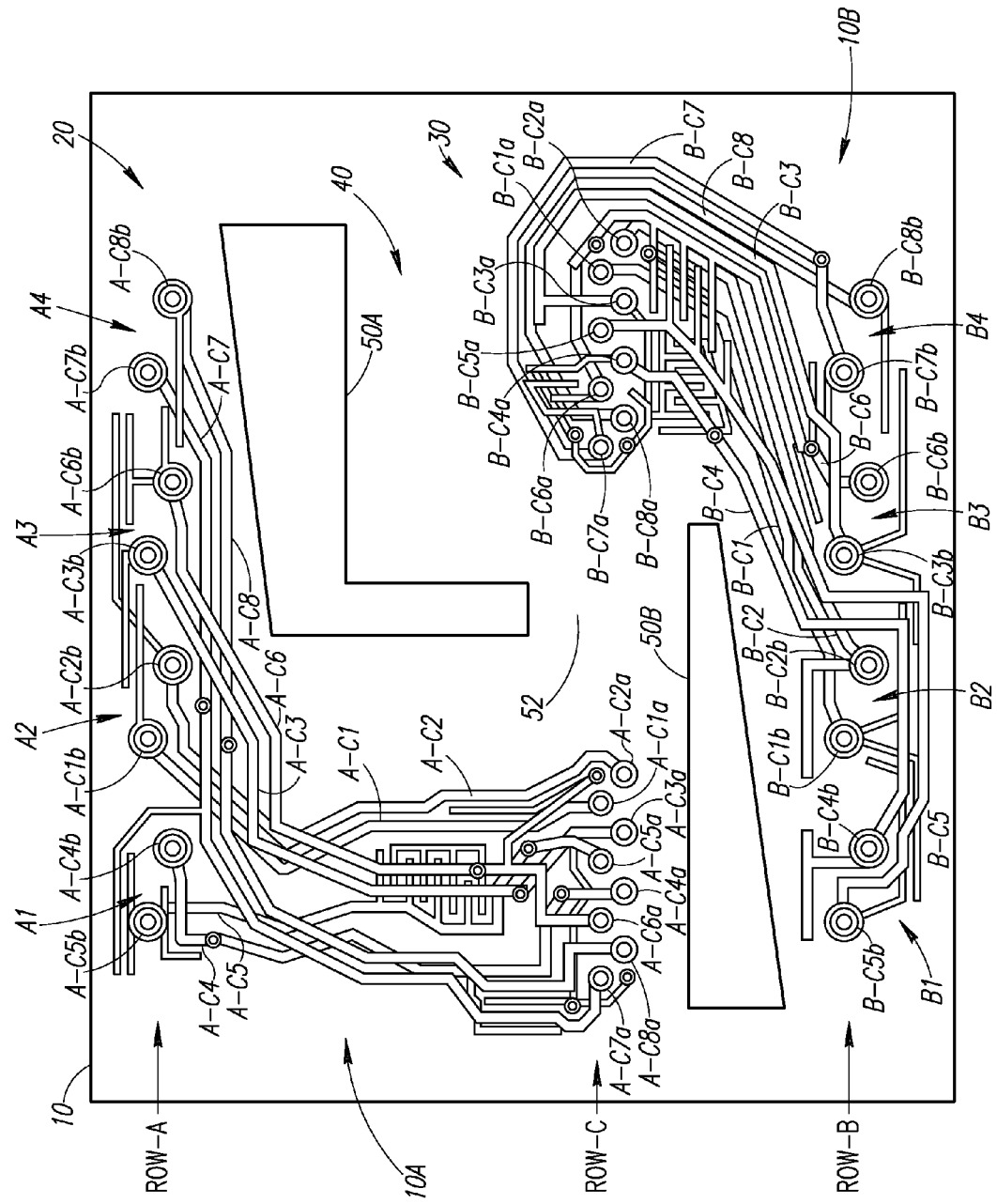
FIG. 2 is an illustration of the substrate of FIG. 1 including cutouts in the intermediate portion.

FIG. 1 illustrates a substrate 10 having a first portion 10A with a first set of circuits 20 spaced apart from a second portion 10B with a second set of circuits 30. As is appreciated by those of ordinary skill in the art, FIGS. 1, 2, and 10 depict portions of the first and second sets of circuits 20 and 30 located on both sides of the substrate 10 simultaneously, one atop the other. Returning to FIG. 1, as mentioned above, each of the sets of circuits 20 and 30 is illustrated as a set of balanced communication circuits. Except for unwanted crosstalk between the first and second sets of circuits 20 and 30, the second set of circuits is electrically separate from the first set of circuits. The embodiments of the first and second sets of circuits 20 and 30 illustrated are provided for illustrative purposes and are not intended to limit the scope of the invention, which is not limited to any particular implementation of the first and second sets of circuits 20 and 30.

In the embodiment illustrated in the drawings, the first set of circuits 20 includes four balanced communication circuits "A1," "A2," "A3," and "A4." Each of the balanced communication circuits "A1," "A2," "A3," and "A4" includes a pair of conductors configured as a differential signaling pair. The balanced communication circuit "A1" includes conductors "A-C4" and "A-C5." The balanced communication circuit "A2" includes conductors "A-C1" and "A-C2." The balanced communication circuit "A3" includes conductors "A-C3" and "A-C6." The balanced communication circuit "A4" includes conductors "A-C7" and "A-C8."

Each of the conductors "A-C1" to "A-C8" conducts a signal between a pair of contacts, such as a pair of plated through holes. The conductor "A-C1" conducts a signal between a first plated through hole "A-C1$a$" that is designed to accept an outlet contact or tine contact "JT-1A" (see FIG. 3) and a second plated through hole "A-C1$b$" that is designed to accept a wire terminating contact, such as an insulation displacement connector "IDC-1A" (see FIG. 4). The conductor "A-C2" conducts a signal between a first plated through hole "A-C2$a$" that is designed to accept an outlet tine contact "JT-2A" (see FIG. 3) and a second plated through hole "A-C2$b$" that is designed to accept a wire terminating contact, such as an insulation displacement connector "IDC-2A" (see FIG. 4). The conductor "A-C3" conducts a signal between a first plated through hole "A-C3$a$" that is designed to accept an outlet tine contact "JT-3A" (see FIG. 3) and a second plated through hole "A-C3$b$" that is designed to accept a wire terminating contact, such as an insulation displacement connector "IDC-3A" (see FIG. 4). The conductor "A-C4" conducts a signal between a first plated through hole "A-C4$a$" that is designed to accept an outlet tine contact "JT-4A" (see FIG. 3) and a second plated through hole "A-C4$b$" that is designed to accept a wire terminating contact, such as an insulation displacement connector "IDC-4A" (see FIG. 4). The conductor "A-C5" conducts a signal between a first plated through hole "A-C5$a$" that is designed to accept an outlet tine contact "JT-5A" (see FIG. 3) and a second plated through hole "A-C5$b$" that is designed to accept a wire terminating contact, such as an insulation displacement connector "IDC-5A" (see FIG. 4). The conductor "A-C6" conducts a signal between a first plated through hole "A-C6$a$" that is designed to accept an outlet tine contact "JT-6A" (see FIG. 3) and a second plated through hole "A-C6$b$" that is designed to accept a wire terminating contact, such as an insulation displacement connector "IDC-6A" (see FIG. 4). The conductor "A-C7" conducts a signal between a first plated through hole "A-C7$a$" that is designed to accept an outlet tine contact "JT-7A" (see FIG. 3) and a second plated through hole "A-C7$b$" that is designed to accept a wire terminating contact, such as an insulation displacement connector "IDC-7A" (see FIG. 4). The conductor "A-C8" conducts a signal between a first plated through hole "A-C8$a$" that is designed to accept an outlet tine contact "JT-8A" (see FIG. 3) and a second plated through hole "A-C8$b$" that is designed to accept a wire terminating contact, such as an insulation displacement connector "IDC-8A" (see FIG. 4).

In the embodiment illustrated in the drawings, the second set of circuits 30 includes four balanced communication circuits "B1," "B2," "B3," and "B4." Each of the balanced communication circuits "B1," "B2," "B3," and "B4" includes a pair of conductors configured as a differential signaling pair. The balanced communication circuit "B1" includes conductors "B-C4" and "B5." The balanced communication circuit "B2" includes conductors "B-C1" and "B-C2." The balanced communication circuit "B3" includes conductors "B-C3" and "B-C6." The balanced communication circuit "B4" includes conductors "B-C7" and "B-C8."

Each of the conductors "B-C1" to "B-C8" conducts a signal between a pair of contacts, such as a pair of plated through holes. The conductor "B-C1" conducts a signal between a first plated through hole "B-C1$a$" that is designed to accept an outlet tine contact "JT-1B" (see FIG. 3) and a second plated through hole "B-C1$b$" that is designed to accept a wire terminating contact, such as an insulation displacement connector "IDC-1B" (see FIG. 4). The conductor "B-C2" conducts a signal between a first plated through hole "B-C2$a$" that is designed to accept an outlet tine contact "JT-2B" (see FIG. 3) and a second plated through hole "B-C2$b$" that is designed to accept a wire terminating contact, such as an insulation displacement connector "IDC-2B" (see FIG. 4). The conductor "B-C3" conducts a signal between a first plated through hole "B-C3$a$" that is designed to accept an outlet tine contact "JT-3B" (see FIG. 3) and a second plated through hole "B-C3$b$" that is designed to accept a wire terminating contact, such as an insulation displacement connector "IDC-3B" (see FIG. 4). The conductor "B-C4" conducts a signal between a first plated through hole "B-C4$a$" that is designed to accept an outlet tine contact "JT-4B" (see FIG. 3) and a second plated through hole "B-C4$b$" that is designed to accept a wire terminating contact, such as an insulation displacement connector "IDC-4B" (see FIG. 4). The conductor "B-C5" conducts a signal between a first plated through hole "B-C5$a$" that is designed to accept an outlet tine contact "JT-5B" (see FIG. 3) and a second plated through hole "B-05$b$" that is designed to accept a wire terminating contact, such as an insulation displacement connector "IDC-5B" (see FIG. 4). The conductor "B-C6" conducts a signal between a first plated through hole "B-C6$a$" that is designed to accept an outlet tine contact "JT-6B" (see FIG. 3) and a second plated through hole "B-C6$b$" that is designed to accept a wire terminating contact, such as an insulation displacement connector "IDC-6B" (see FIG. 4). The conductor "B-C7" conducts a signal between a first plated through hole "B-C7$a$" that is designed to accept an outlet tine contact "JT-7B" (see FIG. 3) and a second plated through hole "B-C7$b$" that is designed to accept a wire terminating contact, such as an insulation displacement connector "IDC-7B" (see FIG. 4). The conductor "B-C8" conducts a signal between a first plated through hole "B-C8$a$" that is designed to accept an outlet tine contact "JT-8B" (see FIG. 3) and a second plated through hole "B-C8$b$" that is designed to accept a wire terminating contact, such as an insulation displacement connector "IDC-8B" (see FIG. 4).

The second plated through holes "A-C1$b$" to "A-C8$b$" connected to the conductors "A-C1" to "A-C8" of the circuits "A1" to "A4" are arranged in a substantially linear row "ROW-A" on the substrate 10 for engagement with the insulation displacement connectors "IDC-1A" to "IDC-8A" (illustrated in FIG. 4), respectively. The second plated through holes "B-C1$b$" to "B-C8$b$" coupled to the conductors "B-C1" to "B-C8" of the circuits "B1" to "B4" are arranged in a substantially linear row "ROW-B" on the substrate 10 for engagement with the insulation displacement connector "IDC-1B" to "IDC-8B" (illustrated in FIG. 4), respectively. As illustrated in FIG. 2, the row "ROW-A" may be substantially parallel to the row "ROW-B." In the embodiment illustrated, the row "ROW-A" is above the row "ROW-B." Thus, the substantially linearly arranged insulation displacement connectors "IDC-1A" to "IDC-8A" are positioned above the substantially linearly arranged insulation displacement connectors "IDC-1B" to "IDC-8B."

The first plated through holes "A-C1a" to "A-C8a" coupled to the conductors "A-C1" to "A-C8" of the circuits "A1" to "A4" and the first plated through holes "B-C1a" to "B-C8a" coupled to the conductors "B-C1" to "B-C8" of the circuits "B1" to "B4" are positioned between the row "ROW-A" and the row "ROW-B." The first plated through holes "A-C1a" to "A-C8a" and the first plated through holes "B-C1a" to "B-C8a" may be arranged in a substantially linear row "ROW-C" located between the rows "ROW-A" and "ROW-B." Further, as illustrated in FIG. 2, the row "ROW-C" may be substantially parallel to the rows "ROW-A" and "ROW-B."

An intermediate portion 40 of the substrate 10 is defined between the first portion 10A of the substrate 10 having the first set of circuits 20 and the second portion 10B of the substrate 10 having the second set of circuits 30. The substrate 10 has a relative static permittivity, which is also referred to as a dielectric constant. Thus, the first portion 10A, the second portion 10B, and the intermediate portion 40 of the substrate 10 each has a dielectric constant. The dielectric constant of a material (often represented as "$\in_r$") is a ratio of the static permittivity of the material (often represented as "$\in_s$"), relative to the static permittivity of a vacuum (referred to as the electric constant often represented as "$\in_0$"). Thus, the dielectric constant is often expressed as $\in_r = \in_s/\in_0$.

Static permittivity describes the ability of a material to transmit (or "permit") an electric field. For example, in a capacitor, an increased permittivity allows the same charge to be stored by a smaller electric field (and thus a smaller voltage), leading to increased capacitance. In general, permittivity is not a constant value, and may vary with position in the material, the frequency of the electric field applied, strength of the electric field applied, humidity, temperature, and other parameters.

Air has a dielectric constant of about one. Thus, if the first and second sets of circuits 20 and 30 were separated only by air, the dielectric constant of the material (i.e., air) separating the first and second sets of circuits 20 and 30 would be about one. Printed Circuit Board ("PCB") has an effective dielectric constant of about three to about five. Therefore, in embodiments in which the substrate 10 is PCB, the first portion 10A, the second portion 10B, and the intermediate portion 40 between the first and second sets of circuits 20 and 30 each have an effective dielectric constant of about three to about five. The "effective" dielectric constant takes into account the fact that electric fields are not entirely constrained within the substrate 10, and portions of the electric fields may exist in the air around the substrate.

If the effective dielectric constant of the intermediate portion 40 of the substrate 10 is greater than one (as is the case when the substrate is PCB), the replacement of all or a portion of the intermediate portion 40 with air reduces the effective dielectric constant of the material separating the first set of circuits 20 from the second set of circuits 30, thereby reducing the overall effective dielectric constant encountered by any electrical field existing between the two sets of circuits. Reducing the effective dielectric constant between the first and second sets of circuits 20 and 30 reduces capacitive coupling between any of the circuits "A1" to "A4" of the first set and any of the circuits "B1" to "B4" of the second set. The reduced capacitive coupling reduces the amount of electrical signal that can be coupled between the first and second sets of circuits 20 and 30, thereby reducing crosstalk between any of the circuits "A1" to "A4" of the first set of circuits 20 and any of the circuits "B1" to "B4" of the second set of circuits 30.

Replacement of all or a portion of the intermediate portion 40 of the substrate 10 with air may be accomplished by removing all or a portion of the intermediate portion 40 from the substrate 10. For example, in FIG. 2, a first cutout 50A and a second cutout 50B have been formed in the intermediate portion 40 of the substrate 10 of FIG. 1. Within the intermediate portion 40 of the substrate 10, the cutouts 50A and 50B are separated by a support portion 52 that provides structural support for the first and second sets of circuits 20 and 30. As is appreciated by those of ordinary skill in the art, removing portions of the intermediate portion 40 of the substrate 10 may negatively affect the utility of the substrate 10. For example, the substrate 10 may fail during manufacture and/or use if too much of the intermediate portion 40 is removed. Thus, one or more support portions, such as the support portion 52, may be provided between adjacent cutouts 50A and 50B to provide structural support for the first and second sets of circuits 20 and 30.

Within the first cutout 50A and the second cutout 50B, the dielectric constant is about one. Thus, any electric field traversing the first cutout 50A or the second cutout 50B would encounter an effective dielectric constant that is different from, and less than, that of the substrate 10 alone. Further, the effective dielectric constant within the cutouts 50A and 50B would be less than that of the first and second portions 10A and 10B of the substrate 10. Any electric field traversing the first cutout 50A or the second cutout 50B would encounter an effective dielectric constant that is less than that of the first and second portions 10A and 10B of the substrate 10, which would have the desirable effect of reducing crosstalk between the first and second sets of circuits 20 and 30. In this manner, the first cutout 50A and the second cutout 50B may be used to help electrically isolate the first set of circuits 20 from the second set of circuits 30 and in doing so, reduce crosstalk between the first and second sets of circuits 20 and 30. There is a benefit at every increment of reduction in the dielectric constant. However, the designer should weigh the cost of removing the material versus the amount of improvement in isolation performance. Since routing is routinely performed on a PBC during the drilling process, the cost of the additional routing is typically very minimal.

It may be desirable to remove as much of the intermediate portion 40 of the substrate 10 as is practical to create a maximum reduction in the effective dielectric constant between the first and second sets of circuits 20 and 30. Those of ordinary skill in the art appreciate that, as a practical matter, physical limitations and manufacturing related issues may limit the amount of the intermediate portion 40 of the substrate 10 that may be removed. For example, maintaining the structural integrity of the substrate 10, and functionality of the first and second sets of circuits 20 and 30 may limit the amount of the intermediate portion 40 that may be removed.

For ease of illustration, the intermediate portion 40 is described as including the cutouts 50A and 50B; however, those of ordinary skill in the art appreciate that a different number of openings (e.g., three, four, etc.) and/or differently shaped openings (e.g., slots) may be formed in the intermediate portion 40 of the substrate 10 and such embodiments are within the scope of the present teachings. Further, a collection of closely spaced relatively small openings may be formed in the intermediate portion 40. By way of another example, the portion removed may not extend all the way through the substrate 10 such that one or more grooves, recesses, and the like are formed in the intermediate portion 40. However, those of ordinary skill in the art appreciate that the routing process typically removes the entire thickness of PBC. Further, any portions of the intermediate portion 40 removed (e.g., cutouts, grooves, recesses, and the like) may be filled with a material having a dielectric constant that is less than the dielectric constant of the substrate 10.

Method

Figure 5:
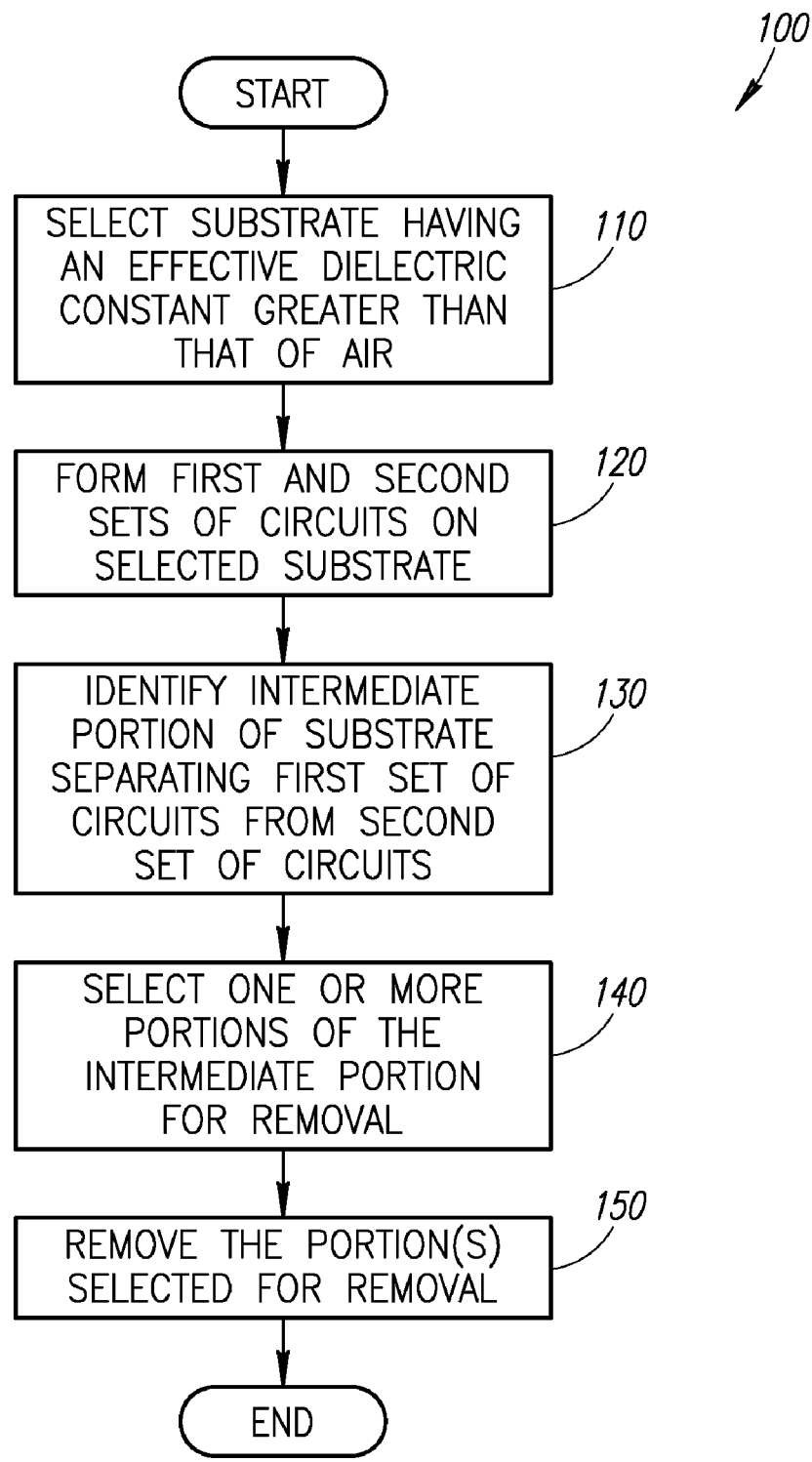
FIG. 5 is a flow chart of a method of improving electrical isolation between the first and second sets of circuits illustrated in FIG. 1, which may be used to produce the substrate of FIG. 2.

Referring to FIG. 5, a method 100 of reducing crosstalk is provided. In first block 110, the substrate 10 having an effective dielectric constant greater than that of air is selected. For example, in block 110, PCB may be selected. In next block 120, the first and second sets of circuits 20 and 30 are formed on the substrate 10. As mentioned above, the first set of circuits 20 is separated from the second set of circuits 30 by the intermediate portion 40 of the substrate 10 (such as shown in FIG. 1). In block 130, the intermediate portion 40 of the substrate 10 separating the first and second sets of circuits 20 and 30 is identified.

Then, in block 140, one or more portions of the intermediate portion 40 are selected for removal. The size, shape, and location of the portion(s) of the intermediate portion 40 selected for removal in block 140 may be determined at least in part based on practical concerns, such as the mechanical stability of the substrate 10. For example, aspects of the manufacturing process may involve pressing a tool and/or another component against the substrate 10 after removal of the selected portions. In such embodiments, the amount of the intermediate portion 40 selected for removal may be limited by the strength of the substrate and its ability to be pressed against without experiencing mechanical failure after removal of the selected portion. By way of a non-limiting example, any unnecessary portions of the intermediate portion 40 may be selected for removal in block 140. In other words, in block 140, a portion of the intermediate portion 40 may be selected that is the largest portion that may be removed without negatively affecting the utility of the substrate 10, the first set of circuits 20, and the second set of circuits 30. In particular implementations, the portion selected for removal is located approximately midway between the first and second sets of circuits 20 and 30. However, this is not a requirement.

Finally, in block 150, any portions of the intermediate portion 40 selected for removal in block 140 are removed. For example, in block 150, the first and second cutouts 50A and 50B may be formed in the substrate 10 (such as shown in FIG. 2). Alternatively, a single cutout or slot (not shown) may be cut into the intermediate portion 40 between the first and second sets of circuits 20 and 30. Those of ordinary skill in the art appreciate that a different number of openings (e.g., three, four, etc.) and/or differently shaped openings (e.g., slots) may be formed between the first set of circuits 20 (see FIG. 2) and the second set of circuits 30 (see FIG. 2) of the substrate 10 and such embodiments are within the scope of the present teachings. By way of another example, the portion selected for removal may not extend all the way through the substrate 10 such that when the portion is removed, one or more recesses (not shown) are formed in the intermediate portion 40.

In block 150, if the substrate 10 is PCB, the portion(s) selected for removal in block 140 may be "routed out" during the PCB manufacturing process. As is appreciated by those of ordinary skill in the art, routing is commonly used in PCB manufacturing to cut out or trim PCB. Routing is also sometimes used to create cutouts or other openings in the PCB. For example, routing is generally used to form mounting holes or create cutouts for mechanical clearance purposes (i.e., to fit the PCB inside the device around other components).

After block 150, the method 100 terminates. As is apparent to those of ordinary skill in the art, block 120 may be performed after blocks 130, 140, and 150 and such embodiments are within the scope of the present teachings.

The method 100 may be used to reduce the effective dielectric constant of whatever materials lie between the first and second sets of circuits 20 and 30 by removing unnecessary portions of the substrate 10 (e.g., PCB material) located between or separating the first and second sets of circuits 20 and 30.

Exemplary Embodiment

Figure 4:
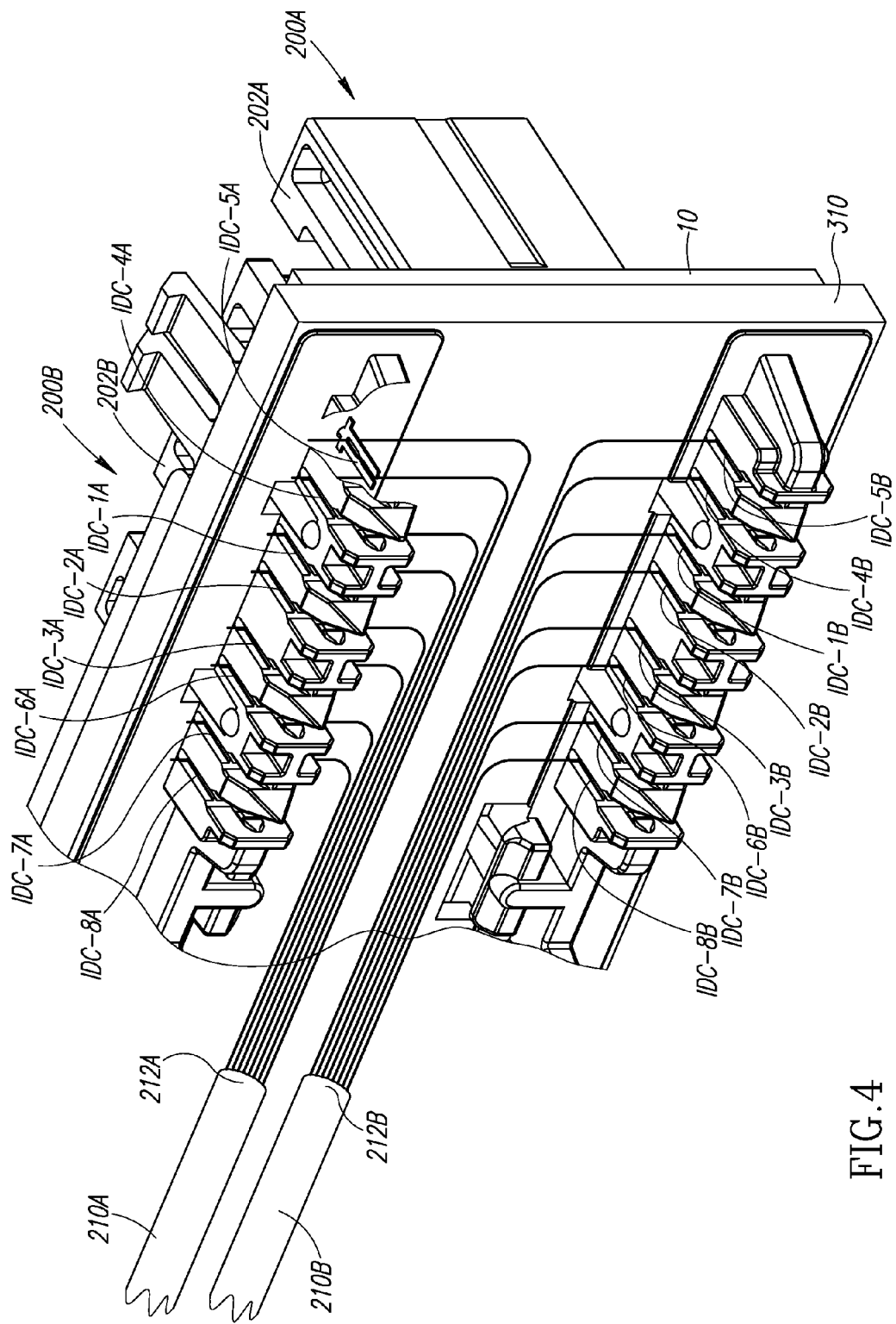
FIG. 4 is a perspective view of the back of the pair of adjacent communication outlets of FIG. 3 illustrating their insulation displacement connectors coupled to first and second communication cables.

The first and second sets of circuits 20 and 30 of FIG. 2 may each form a portion of a conventional "RJ-45" type communication outlet. FIGS. 3 and 4 illustrate a pair of communication outlets 200A and 200B, which may each be optionally constructed to satisfy Augmented Category 6 transmission performance requirements specified in TIA 568B.2—Addendum 10.

The communication outlet 200A includes the outlet tine contacts "JT-1A" to "JT-8A" coupled to wire termination contacts, which have been illustrated as the insulation displacement connectors "IDC-1A" to "IDC-8A." In the embodiment illustrated, the outlet tine contacts "JT-1A" to "JT-8A" are coupled to the insulation displacement connectors "IDC-1A" to "IDC-8A," respectively. The communication outlet 200A includes an outlet housing 202A couplable to the substrate 10 by any method known in the art. The outlet housing 202A has an opening 208A inside which the plurality of outlet tine contacts "JT-1A" to "JT-8A" are disposed. The insulation displacement connectors "IDC-1A" to "IDC-8A" are couplable to an end portion 212A of a first communication cable 210A (see FIG. 4).

The communication outlet 200B includes the outlet tine contacts "JT-1B" to "JT-8B" coupled to wire termination contacts, which have been illustrated as the insulation displacement connectors "IDC-1B" to "IDC-8B." In the embodiment illustrated, the outlet tine contacts "JT-1B" to "JT-8B" are coupled to the insulation displacement connectors "IDC-1B" to "IDC-8B," respectively. The communication outlet 200B includes an outlet housing 202B couplable to the substrate 10 by any method known in the art. The outlet housing 202B has an opening 208B inside which the plurality of outlet tine contacts "JT-1B" to "JT-8B" are disposed. The insulation displacement connectors "IDC-1B" to "IDC-8B" are couplable to an end portion 212B of a second communication cable 210B (see FIG. 4).

The wire termination contacts coupled to the second plated through holes "A-C1$b$" to "A-C8$b$" (see FIG. 2) of the first set of circuits 20, and the second plated through holes "B-C1$b$" to "B-C8$b$" (see FIG. 2) of the second set of circuits 30 have been described as being the insulation displacement connectors "IDC-1A" to "IDC-8A" and "IDC-1B" to "IDC-8B," respectively. Those of ordinary skill in the art appreciate that other types of wire termination contacts and/or cable connectors may be used to provide an interface between the first set of circuits 20 and the first communication cable 210A, and the second set of circuits 30 and the second communication cable 210B, and such implementations are within the scope of the present teachings.

Referring to FIGS. 3 and 6, the openings 208A and 208B of the outlet housings 202A and 202B are each designed to receive and removably retain one of communication plugs 220A and 220B, respectively, which may each be constructed according to the RJ-45 standard. Methods of constructing the communication plugs 220A and 220B are well known in the art and will not be described in detail.

The communication plug 220A is coupled to an end portion 232A of a third communication cable 230A and includes a plurality of plug contacts "PT-1A" to "PT-8A" each corresponding to one of the outlet tine contacts "JT-1A" to "JT-8A," respectively, of the communication outlet 200A. When the communication plug 220A is received inside the opening 208A of the communication outlet 200A, each of the plug contacts "PT-1A" to "PT-8A" engages with one of the outlet tine contacts "JT-1A" to "JT-8A," forming an electrical connection therewith. Thus, the outlet housing 202A provides an interface with the communication plug 220A. Inside the communication outlet 200A, the first set of circuits 20 (see FIG. 2) conducts signals between the outlet tine contacts "JT-1A" to "JT-8A" and the plurality of insulation displacement connectors "IDC-1A" to "IDC-8A," respectively. Thus, the communication outlet 200A and communication plug 220A together form an interface between the first communication cable 210A (see FIG. 4) and the third communication cable 230A, respectively.

The communication plug 220B is coupled to an end portion 232B of a fourth communication cable 230B and includes a plurality of plug contacts "PT-1B" to "PT-8B" each corresponding to one of the outlet tine contacts "JT-1B" to "JT-8B," respectively, of the communication outlet 200B. When the communication plug 220B is received inside the opening 208B of the communication outlet 200B, each of the plug contacts "PT-1B" to "PT-8B" engages with one of the outlet tine contacts "JT-1B" to "JT-8B," forming an electrical connection therewith. Thus, the outlet housing 202B provides an interface with the communication plug 220B. Inside the communication outlet 200B, the second set of circuits 30 (see FIG. 2) conducts signals between the outlet tine contacts "JT-1B" to "JT-8B" and the plurality of insulation displacement connectors "IDC-1B" to "IDC-8B" (see FIG. 4), respectively. Thus, the communication outlet 200B and communication plug 220B together form an interface between the second communication cable 210B (see FIG. 4) and fourth communication cable 230B, respectively.

Each of the circuits "A1" to "A4" and "B1" to "B4" of the sets of circuits 20 and 30, respectively, may potentially experience crosstalk from another circuit on the same substrate. Crosstalk (or conversely electric isolation) between the four circuits "A1" to "A4" of the first set of circuits 20 may be addressed using any methods known in the art. Similarly, crosstalk between the four circuits "B1" to "B4" of the second set of circuits 30 may be addressed using any methods known in the art. For example, the amount of crosstalk may be reduced by the structure of the wire terminating contacts (e.g., the insulation displacement connectors) used, the layout of the insulation displacement connectors, the internal structure of the communication outlets, the layout of the conductors "A-C1" to "A-C8" and "B-C1" to "B-C8," and the application of any other technique known in the art.

Crosstalk between different communication outlets (e.g., between communication outlets 200A and 200B) is commonly referred to as alien crosstalk ("AXT"). The Augmented Category 6 specification includes requirement for an acceptable amount of electric isolation between the communication outlets 200A and 200B. As discussed above, the amount of AXT between the first set of circuits 20 and the second set of circuits 30 on the substrate 10 may be reduced by the inclusion of one or more slots, apertures, cutouts (e.g., the cutouts 50A and 50B illustrated in FIG. 2), recesses, and the like formed in the intermediate portion 40 of the substrate 10 between the sets of circuits. The method 100 (see FIG. 5) may be performed to reduce or eliminate AXT between the communication outlets 200A and 200B. As is apparent to those of ordinary skill in the art, the amount of the intermediate portion 40 removed to form the one or more slots, apertures, cutouts, recesses, and the like may be limited at least in part by mechanical and/or manufacturing considerations.

Panel System

FIG. 7 illustrates a panel 300 configured to house or otherwise support the pair of communication outlets 200A and 200B and a plurality of additional like (or similar) communication outlets 200C-200X. In the embodiment illustrated, the panel 300 includes the twenty-four communication outlets 200A-200X. Within the panel 300, it may be desirable to arrange the communication outlets 200A-200X together in a single linear array. However, panels including two or more linear arrays of communication outlets are also within the scope of the present teachings.

The panel 300 includes a support frame 318 couplable to a rack system 320. The rack system 320 may be implemented as either a conventional or custom rack system. By way of a non-limiting example, the rack system 320 has an opening 312 with a width "W" of about 19 inches and divided (vertically or otherwise) into a plurality of rack units. A single rack unit is typically referred to as a "RU." The panel 300 may be configured to fit within a predetermined amount of space or a predetermined number of rack units in the rack system 320. For example, the panel 300 may be configured to fit within one rack unit or "1 RU." However, this is not a requirement.

In embodiments in which the rack system 320 has a usable width "W" of about 18 inches, and the panel 300 includes the twenty-four communication outlets 200A-200X evenly spaced across the width "W" of the panel 300 (i.e., approximately 18 inches), each communication outlet may occupy up to about 0.75 inches (i.e., 18 inches/24 communication outlets≈0.75 inches per communication outlet). In a typical implementation, the communication plugs 220A and 220B are each about 0.62 inches wide, which leaves little space between adjacent communication outlets 200A-200X in the panel 300.

The communication outlets 200A-200X may be divided into twelve pairs with each pair sharing a common substrate substantially similar to the substrate 10 (see FIG. 8). The pairs of communication outlets 200A-200X may be organized into groupings "G1" to "G4" (see FIG. 7) each having a housing 328. The panel 300 is configured to receive the groupings "G1" to "G4" and couple them to the rack system 320. The groupings "G1" to "G4" may be separated from one another by a gap 330. The gap 330 may be filled with air or an insulating material (not shown). The gap 330 helps reduce crosstalk between the communication outlets of adjacent groupings.

By way of a non-limiting example, three pairs (i.e., six communication outlets) may be included in each grouping "G1" to "G4." Because the groupings "G2," "G3," and "G4" are substantially similar to the grouping "G1," for illustrative purposes, only the grouping "G1" will be described. As may best be viewed in FIG. 9, the grouping "G1" includes the communication outlets 200A-200F, divided into three pairs and coupled to three spaced apart substrates 10 each having a first set of circuits (e.g., the first set of circuits 20 illustrated in FIG. 2) spaced apart from a second set of circuits (e.g., the second set of circuits 30 illustrated in FIG. 2). The grouping "G1" includes a housing 328 configured to receive the three spaced apart substrates 10 with the communication outlets 200A-200F coupled thereto.

Referring to FIGS. 8 and 9, within the grouping "G1," each of the substrates 10 may be separated from adjacent substrates by an air-filled gap 332. Within the air-filled gaps 332, the effective dielectric constant is about one. Thus, if the substrates 10 have effective dielectric constant is greater than one, each of the air filled gaps 332 reduces crosstalk between the sets of circuits 20 and 30 disposed on a particular one of the substrates and the sets of circuits 20 and 30 disposed on an adjacent substrate separated from the particular substrate by the gap 332.

As explained above and illustrated in FIG. 8, the substantially linearly arranged insulation displacement connectors "IDC-1A" to "IDC-8A" are positioned above the insulation displacement connectors "IDC-1B" to "IDC-8B." Turning to FIG. 7, if the communication outlets 200A-200X are numbered 1 to 24 (e.g., the communication outlet 200A is assigned the number 1, the communication outlet 200B is assigned the number 2, and so on), the insulation displacement connectors coupled to the communication outlets assigned odd numbers (e.g., the communication outlet 200A) will be located above the communication outlets assigned even numbers (e.g., the communication outlet 200B). As may be viewed in FIG. 8, the insulation displacement connectors coupled to the communication outlets assigned odd numbers (e.g., communication outlets 200A, 200C, and 200E) may form an upper row 302 of insulation displacement connectors and the insulation displacement connectors of the communication outlets assigned even numbers (e.g., communication outlets 200B, 200D, and 200F) may form a lower row 304 of insulation displacement connectors.

The insulation displacement connectors of the upper row 302 and the lower row 304 may be coupled to a back plate 310 configured to mate with the housing 328 and couple the insulation displacement connectors with the substrates 10. By way of a non-limiting example, the back plate 310 may be configured to snap into the housing 328.

The insulation displacement connectors "IDC-1A" to "IDC-8A" of the grouping "G1" along the upper row 302 may be covered by a first cover 312 (see FIG. 9) that may help protect the connections between the insulation displacement connectors "IDC-1A" to "IDC-8A" and the end portion 212A (see FIG. 4) of the first communication cable 210A. The insulation displacement connectors "IDC-1B" to "IDC-8B" of the grouping "G1" along the lower row 304 may be covered by a second cover 314 (see FIG. 9) that may help protect the connections between the insulation displacement connectors "IDC-1B" to "IDC-8B" and the end portion 212B (see FIG. 4) of the second communication cable 210B.

Returning to FIGS. 2 and 4, as mentioned above, the first plated through holes "A-C1a" to "A-C8a" (which are designed to accept the outlet tine contacts "JT-1A" to "JT-8A") and the first plated through holes "B-C1a" to "B-C8a" (which are designed to accept the outlet tine contacts "JT-1B" to "JT-8B") may be arranged in the substantially linear row "ROW-C" located between the rows "ROW-A" and "ROW-B." Thus, as may be viewed in FIGS. 7 and 9, the communication outlet 200A and communication outlet 200B, including their respective outlet tine contacts "JT-1A" to "JT-8A" and outlet tine contacts "JT-1B" to "JT-8B," are arranged in a single row 306 adjacent the row "ROW-C."

When the groupings "G1" to "G4" are received inside the panel 300, the rows 306 of outlet tine contacts of the groupings "G1" to "G4" extend across the width of the panel 300 between the upper row 302 of insulation displacement connectors "IDC-1A" to "IDC-8A" and the lower row 304 of insulation displacement connectors "IDC-1B" to "IDC-8B" of each of the groupings "G1" to "G4." When communication plugs (e.g., the communication plugs 220A and 220B illustrated in FIG. 6) are received inside the openings (e.g., openings 208A and 208B) of the communication outlets 200A-200X of the groupings "G1" to "G4," the communication plugs are arranged in a linear array (not shown) across the width of the panel.

Turning to FIGS. 8 and 9, the cutouts 50A and 50B are formed in each of the substrates 10 between the first set of circuits 20 (see FIG. 2) and the second set of circuits 30 (see FIG. 2) incorporated into the communication outlets 200A-200F. Specifically, the cutouts 50A and 50B are formed in the substrate 10 between the first set of circuits 20 (see FIG. 2) incorporated into the communication outlet 200A and the second set of circuits 30 (see FIG. 2) incorporated into the communication outlet 200B. Similarly, the cutouts 50A and 50B are formed in the substrate 10 between the set of circuits 20 (see FIG. 2) incorporated into the communication outlet 200C and the set of circuits 30 (see FIG. 2) incorporated into the communication outlet 200D. Further, the cutouts 50A and 50B are formed in the substrate 10 between the set of circuits 20 (see FIG. 2) incorporated into the communication outlet 200E and the set of circuits 30 (see FIG. 2) incorporated into the communication outlet 200F.

While each of the substrates 10 is illustrated as including the cutouts 50A and 50B, those of ordinary skill in the art appreciate that a different number (e.g., one, three, etc.) of openings and/or differently shaped openings (e.g., slots) may be formed between the first set of circuits 20 (see FIG. 2) and the second set of circuits 30 (see FIG. 2) of one or more of the substrates 10 and such embodiments are within the scope of the present teachings. Further, as mentioned above, one or more recesses (instead of openings) may be formed between the first set of circuits 20 (see FIG. 2) and the second set of circuits 30 (see FIG. 2) of one or more of the substrates 10. By way of another example, one or more openings and one or more recesses may both be formed between the first set of circuits 20 (see FIG. 2) and the second set of circuits 30 (see FIG. 2) of one or more of the substrates 10.

While the groupings "G1" to "G4" have been described as each having six communication outlets 200A-200X, those of ordinary skill in the art appreciate that the communication outlets 200A-200X may be divided into groupings having any number of communication outlets (e.g., three, four, five, six, eight, twelve, twenty-four, and the like). Further, while each of the substrates 10 has been described as configured for a pair of the communication outlets 200A-200X, those of ordinary skill in the art appreciate that the substrates 10 may be configured for any number of communication outlets (e.g., three, four, five, six, eight, twelve, twenty-four, and the like). In such embodiments, portions of each substrate 10 located between adjacent communication outlets may be removed to reduce crosstalk between the adjacent communication outlets.

Simulation Results

Referring to FIGS. 1 and 2, Table 1 below shows the predicted alien crosstalk ("AXT") results in decibels ("dB") calculated using an electrical field simulation program on the first and second sets of circuits 20 and 30 disposed on the same substrate 10, which was simulated as PCB. Results were calculated at only a single frequency, 500 MHZ, using Ansoft HFSS software, which is a simulation tool believed to be familiar to and accepted by those of ordinary skill in the art. Table 1 shows the projected AXT results between each of the first set of circuits 20 (i.e., circuits "A1," "A2," "A3," and "A4") and each of the second set of circuits 30 (i.e., circuits "B1," "B2," "B3," and "B4") both with and without cutouts 50A and 50B as depicted in FIGS. 1 and 2, respectively.

The average level of AXT for all results obtained for the substrate without cutouts 50A and 50B is approximately −82.1 dB with a highest level of AXT observed being approximately −69 dB.

The average level of AXT for all results obtained for the substrate with cutouts 50A and 50B is approximately −83.7 dB with a highest level of AXT observed being approximately −73 dB. Therefore, the simulation predicts that the inclusion of cutouts 50A and 50B in the substrate 10 (PCB) will reduce average AXT by approximately 1.6 dB and the highest level of AXT observed by approximately 4 dB for the first and second sets of circuits 20 and 30.

TABLE 1

| Circuit combination | AXT for PCB without cutouts | AXT for PCB with cutouts | Change in AXT |
|---|---|---|---|
| A1 to B1 | −77 | −79 | −2 |
| A1 to B2 | −70 | −73 | −3 |
| A1 to B3 | −69 | −75 | −6 |
| A1 to B4 | −84 | −87 | −3 |
| A2 to B1 | −86 | −85 | +1 |
| A2 to B2 | −83 | −84 | −1 |
| A2 to B3 | −87 | −89 | −2 |
| A2 to B4 | −91 | −92 | −1 |
| A3 to B1 | −83 | −84 | −1 |
| A3 to B2 | −84 | −83 | +1 |
| A3 to B3 | −78 | −79 | −1 |
| A3 to B4 | −82 | −87 | −5 |
| A4 to B1 | −87 | −91 | −4 |
| A4 to B2 | −100 | −94 | +6 |
| A4 to B3 | −79 | −81 | −2 |
| A4 to B4 | −73 | −76 | −3 |
| Average | −82.1 | −83.7 | −1.6 |
| Highest Level AXT | −69 | −73 | −4 |

Note that the results above do include the other components of the first and second communication outlets 200A and 200B, such as the outlet tine contacts "JT-1A" to "JT-8A" and "JT-1B" to "JT-8B," the wire terminating contacts (e.g., the insulation displacement connectors "IDC-1A" to "IDC-8A" and "IDC-1B" to "IDC-8B"), and the like that may also affect AXT. However, these components are the same for first and second communication outlets 200A and 200B and were independently designed and located in such a manner as to reduce or minimize their contribution to AXT.

Laboratory Test Results

To confirm the simulation results, laboratory AXT testing was performed using a PCB 500 (depicted in FIG. 10) with a cutout 510 separating the first and second sets of circuits 20 and 30 and a substantially identical PCB (not shown) that did not include cutouts separating the first and second sets of circuits 20 and 30. For each of the first PCB 500 and the second PCB (not shown), a first communication cable 520A was electrically connected by its proximal end portion 522A to the first set of circuits 20 using the plated through holes "A-C1b" to "A-C8b." For each of the first PCB 500 and the second PCB (not shown), a second communication cable 520B was coupled by its proximal end portion 522B to the second set of circuits 30 using the plated through holes "B-C1b" to "B-C8b." In each case, the eight wires were inserted into their corresponding through hole and soldered into position making for a good electrical connection. The plated through holes "A-C1a" to "A-C8a," and "B-C1a" to "B-C8a" may be implemented as plated through holes. Each of the first and second communication cables 520A and 520B used for each the first and second PCBs included eight individual conductors or wires "W1" to "W8." The first and second communication cables 520A and 520B were each implemented as sections of high grade Augmented Category 6 patch cord approximately two meters in length.

To measure only the AXT of the PCB, the insulation displacement connectors "IDC-1A" to "IDC-8A" normally inserted into the plated through holes "A-C1b" to "A-C8b" of the first set of circuits 20, and the insulation displacement connectors "IDC-1B" to "IDC-8B" normally inserted into the plated through holes "B-C1b" to "B-C8b" of the second set of circuits 30, were omitted from both the first PCB 500 with the cutout 510 and the second PCB (not shown) without a cutout portion. Instead, the individual wires "W1" to "W8" at the proximal end 522A of the first communication cable 520A were inserted into the plated through holes "A-C1b" to "A-C8b," respectively, and soldered to the first set of circuits 20. The wires "W1" to "W8" at the proximal end 522B of the second communication cable 520B were inserted into the plated through holes "B-C1b" to "B-C8b," respectively, and soldered to the second set of circuits 30.

Similarly and for the same reason, the outlet tine contacts "JT-1A" to "JT-8A" normally connected to the PCB via plated through holes "A-C1a" to "A-C8a," respectively, of first set of circuits 20, and the outlet tine contacts "JT-1B" to "JT-8B" normally connected to the PCB via plated through holes "B-C1a" to "B-C8a," respectively, of the second set of circuits 30, were omitted from the first PCB 500 with the cutout 510 and the second PCB (not shown) without a cutout. Instead, small approximately 100 ohm chip resistors "A-R1," "A-R2," "A-R3," and "A-R4" terminated each of the circuits "A1" to "A4" (see FIG. 2) respectively. In other words, the resistor "A-R1" was coupled between the plated through holes "A-C4a" and "A-C5a," the resistor "A-R2" was coupled between the plated through holes "A-C1a" and "A-C2a," the resistor "A-R3" was coupled between the plated through holes "A-C3a" and "A-C6a," and the resistor "A-R4" was coupled between the plated through holes "A-C7a" and "A-C8a." Similarly, small approximately 100 ohm chip resistors "B-R1," "B-R2," "B-R3," and "B-R4" terminated each of the circuits "B1" to "B4" (see FIG. 2), respectively. Specifically, the resistor "B-R1" was coupled between the plated through holes "B-C4a" and "B-05a," the resistor "B-R2" was coupled between the plated through holes "B-C1a" and "B-C2a," the resistor "B-R3" was coupled between the plated through holes "B-C3a" and "B-C6a," and the resistor "B-R4" was coupled between the plated through holes "B-C7a" and "B-C8a."

AXT was measured at the distal ends (not shown) of the first and second communication cables 520A and 520B using a network analyzer (not shown). For each of the first PCB 500 and the second PCB (not shown), measurements were collected for all sixteen pair combinations (shown in Table 1 above) between the first and second sets of circuits 20 and 30. Unlike the simulation discussed above where AXT was calculated at only a single frequency, (i.e., 500 MHZ), in the laboratory, AXT was measured at many different frequencies from 100 MHZ to 500 MHZ.

From this data, the average and highest levels of AXT were calculated for each of the first PCB 500 and the second PCB (not shown) over the entire frequency range measured. Results for average levels of AXT for the first PCB 500 and the second PCB (not shown) are provided in FIG. 11. Results for highest levels of AXT for the first PCB 500 and the second PCB (not shown) are provided in FIG. 12.

As FIG. 11 illustrates, the average AXT measured on the PCB 500 with the cutout 510 is somewhat less than the average AXT measured on the PCB (not shown) without a cutout portion. This holds true at most of the frequencies measured. FIG. 12 illustrates the highest level AXT measured on the PCB 500 with the cutout 510 is substantially less than the highest level of AXT measured on the PCB (not shown) without a cutout portion; however, once again, there are a few frequencies where this is not the case. Irregularities in AXT measurements may be caused by reflections of signals at various points in the circuits under test, which can cause irregularities in the readings that account for fluctuations over the frequency range and therefore the occasional deviation from desired results as seen here. This measurement phenomenon is well understood by those of ordinary skill in the art and will not be described in detail. However generally it can clearly be seen that the PCB 500 with the cutout 510 does provide for better AXT isolation between the first and second sets of circuits 20 and 30. This is especially true in the case of the highest level readings of AXT, which, in practice, are found to be the most troublesome within communication systems. These measured results along with the electrical field simulation results (discussed above) demonstrate the benefits of including cutouts (e.g., the cutout 510) to improve alien crosstalk isolation between circuits located on the same PCB.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A communication outlet assembly for use with a first communication plug having a first plurality of plug contacts, and a second communication plug having a second plurality of plug contacts, the communication outlet assembly comprising:
   a substrate having an effective dielectric constant and a first set of circuits separated from a second set of circuits by an intermediate portion of the substrate having an aperture formed therein of a size and shape to reduce the effective dielectric constant of the intermediate portion to below the effective dielectric constant of the substrate, the effective dielectric constant being reduced by the aperture by an amount sufficient to reduce crosstalk between the first set of circuits and the second sets of circuits;
   a first outlet housing adjacent the substrate and having a first plurality of outlet contacts disposed inside an aperture configured to receive the first communication plug, the first plurality of outlet contacts being electrically coupled to the first set of circuits and electrically couplable to the first plurality of plug contacts of the first communication plug when the first communication plug is received inside the aperture of the first outlet housing;
   a second outlet housing adjacent the substrate and having a second plurality of outlet contacts disposed inside an aperture configured to receive the second communication plug, the second plurality of outlet contacts being electrically coupled to the second set of circuits and electrically couplable to the second plurality of plug contacts of the second communication plug when the second communication plug is received inside the aperture of the second outlet housing;
   a first plurality of wire terminating contacts electrically coupled to the first set of circuits to communicate with the first plurality of outlet contacts; and
   a second plurality of wire terminating contacts electrically coupled to the second set of circuits to communicate with the second plurality of outlet contacts.

2. The communication outlet assembly of claim 1, wherein the first plurality of wire terminating contacts comprises a first plurality of insulation displacement connectors, and the second plurality of wire terminating contacts comprises a second plurality of insulation displacement connectors.

3. The communication outlet assembly of claim 1 for use with a first communication cable and a second communication cable, the first communication cable comprising a first plurality of wires and the second communication cable comprising a second plurality of wires, each of the first plurality of wire terminating contacts being coupled to one of the first plurality of wires of the first communication cable, and each of the second plurality of wire terminating contacts being coupled to one of the second plurality of wires of the second communication cable.

4. A communication outlet assembly for use with a plurality of communication plugs each having a plurality of plug contacts, the communication outlet assembly comprising:
a plurality of plug receiving portions each configured to receive a selected one of the plurality of communication plugs and having a plurality of outlet contacts electrically couplable to the plurality of plug contacts of the selected communication plug when the selected communication plug is received inside the plug receiving portion;
a plurality of spaced apart substrates, each substrate having an effective dielectric constant and a first set of circuits separated from a second set of circuits by an intermediate portion of the substrate having an aperture formed therein of suitable size and shape to reduce the effective dielectric constant of the intermediate portion to below the effective dielectric constant of the substrate and by an amount sufficient to reduce crosstalk between the first set of circuits and the second sets of circuits, the first set of circuits and the second set of circuits of each of the substrates being coupled to the plurality of outlet contacts of a different one of the plurality of plug receiving portions to effect electrical communication therewith; and
a plurality of wire terminating contacts each electrically coupled to one of the first set of circuits and the second set of circuits of a selected one of the plurality of spaced apart substrates, each of the plurality of wire terminating contacts being couplable to a communication cable to effect electrical communication between the communication cable and the one of the first set of circuits and the second set of circuits of the selected substrate to which the communication connector is coupled.

5. The communication outlet assembly of claim 4, wherein the plurality of spaced apart substrates are separated by an air filled gap.

6. The communication outlet assembly of claim 4, wherein the plurality of wire terminating contacts comprise insulation displacement connectors.

7. A communication outlet assembly comprising:
a plurality of communication outlets organized into pairs having a substrate, a first plug interface, a second plug interface, a first cable interface, and a second cable interface, for each pair of communication outlets, the substrate having a first portion with a first circuit coupling the first plug interface to the first cable interface, a second portion with a second circuit coupling the second plug interface to the second cable interface, and a third portion located between the first portion and the second portion, the third portion of the substrate comprising a cutout portion, each of the first, second, and third portions having a dielectric constant, the cutout portion of the third portion being configured to reduce the dielectric constant of the third portion relative to the dielectric constants of the first and second portions of the substrate by an amount sufficient to reduce crosstalk between the first circuits and the second circuits.

8. A patch panel for use with a plurality of communication plugs, and a plurality of communication cables, and being mountable to a rack system, the patch panel comprising:
a support frame mountable to the rack system; and
a plurality of communication outlets mounted to the support frame, each having a plug receiving portion with outlet contacts and configured to receive a selected one of the plurality of communication plugs and a cable interface couplable to a selected one of the plurality of communication cables,
the plurality of communication outlets being organized into pairs having a first communication outlet and a second communication outlet sharing a common substrate having an effective dielectric constant, for each pair of communication outlets, the substrate having:
a first circuit electrically coupling the outlet contacts of the plug receiving portion of the first communication outlet to the cable interface of the first communication outlet, the first communication outlet transferring signals between a selected one of the plurality of communication plugs and a selected one of the plurality of communication cables when the selected communication plug is received inside the plug receiving portion of the first communication outlet and the cable interface of the first communication outlet is coupled to the selected communication cable,
a second circuit electrically coupling the outlet contacts of the plug receiving portion of the second communication outlet to the cable interface of the second communication outlet, the second communication outlet transferring signals between a different selected one of the plurality of communication plugs and a different selected one of the plurality of communication cables when the different selected communication plug is received inside the plug receiving portion of the second communication outlet and the cable interface of the second communication outlet is coupled to the different selected communication cable, and
a cutout portion between the first circuit and the second circuit to provide the cutout portion with an effective dielectric constant that is less than the effective dielectric constant of the substrate by an amount sufficient to reduce crosstalk between the first circuit and the second circuit.

9. The patch panel of claim 8, wherein at least a portion of the substrates of the pairs of communication outlets are separated from one another by an air filled gap.

10. The patch panel of claim 8, wherein the pairs of communication outlets are organized into groupings, each grouping housed in a separate housing mounted to the support frame, the separate housings of the groupings being separated from one another by a gap.

11. A substrate comprising:
a first portion having an effective dielectric constant and a first circuit;
a second portion having an effective dielectric constant and a second circuit; and
an intermediate portion located between the first and second portions of the substrate, the intermediate portion having an effective dielectric constant and a cutout portion configured to reduce the effective dielectric constant of the intermediate portion to a value below the effective dielectric constant of both the first portion of the substrate and the second portion of the substrate by an amount sufficient to reduce crosstalk between the first circuit and the second circuit.

12. The communication outlet assembly of claim 1, wherein the substrate is a printed circuit board.

* * * * *